United States Patent
Al-Sehemi et al.

(10) Patent No.: US 11,205,737 B1
(45) Date of Patent: Dec. 21, 2021

(54) PHOTOMEMCAPACITOR AND METHOD FOR THE PRODUCTION THEREOF

(71) Applicant: KING ABDULAZIZ UNIVERSITY, Jeddah (SA)

(72) Inventors: Abdullah G. Al-Sehemi, Abha (SA); Ahmed A. Al-Ghamdi, Jeddah (SA); Abul Kalam, Abha (SA); Aysegul Dere, Elazig (TR); Fahrettin Yakuphanoglu, Elazig (TR)

(73) Assignees: KING ABDULAZIZ UNIVERSITY, Jeddah (SA); KING KHALID UNIVERSITY, Abha (SA)

( * ) Notice: Subject to any disclaimer, the term of this patent is extended or adjusted under 35 U.S.C. 154(b) by 0 days.

(21) Appl. No.: 17/306,243

(22) Filed: May 3, 2021

(51) Int. Cl.
| | |
|---|---|
| *H01L 31/11* | (2006.01) |
| *H01L 31/108* | (2006.01) |
| *H01L 31/109* | (2006.01) |
| *H01L 31/032* | (2006.01) |

(52) U.S. Cl.
CPC .......... *H01L 31/11* (2013.01); *H01L 31/032* (2013.01); *H01L 31/108* (2013.01); *H01L 31/109* (2013.01)

(58) Field of Classification Search
CPC ..... H01L 31/11; H01L 31/109; H01L 31/032; H01L 31/108
See application file for complete search history.

(56) References Cited

U.S. PATENT DOCUMENTS

| | | |
|---|---|---|
| 2011/0127410 A1 | 6/2011 | Tanaka et al. |
| 2013/0140625 A1 | 6/2013 | Piao et al. |
| 2017/0005283 A1 | 1/2017 | Al-Ghamdi et al. |

OTHER PUBLICATIONS

Yalcin et al. Sr-doped yttrium nickel oxide-based photodetectors. Jan. 13, 2020. Journal of Materials Science: Materials in Electronics. 31:3441-3455.*
Alyamani et al., Photoresponse and photocapacitor properties of Au/AZO/p-Si/Al diode with AZO film prepared by pulsed laser deposition (PLD) method, Appl. Phys. A (2016)122:297, DOI 10.1007/s00339-016-9812-5.

* cited by examiner

*Primary Examiner* — Hoang-Quan Ho
(74) *Attorney, Agent, or Firm* — W&C IP (57) ABSTRACT

A photomemcapacitor device comprising a metal oxide semiconductor material is provided. The photocapacitor device comprises a p-n junction and a Schottky junction. A photomemcapacitor is provided for responding to photons at specified wavelengths.

8 Claims, 7 Drawing Sheets
(6 of 7 Drawing Sheet(s) Filed in Color)

PHOTOMEMCAPACITOR AND METHOD FOR THE PRODUCTION THEREOF

FIELD OF THE INVENTION

The invention generally relates to composite semiconductors and, more specifically, photocapacitor devices for use in optoelectronic applications. The invention further relates to unique photoreactive materials.

BACKGROUND

There are various types of capacitive structures such as p-n junction capacitors, metal-oxide-semiconductor (MOS) capacitors, metal-insulator-metal (MIM) capacitors, and metal-insulator-semiconductor (MIS) capacitors. These types of capacitive structures are used in integrated circuits (ICs) such as monolithic microwave integrated circuits (MMIC) and radio frequency integrated circuits (RFIC).

Some capacitors qualify as photocapacitors. An MIS photocapacitor, for example, exhibits a capacitive behavior with solar light illumination. Photocapacitors can be used in electronic and active pixel sensor (APS) technology applications.

Solid-state image sensor technology is largely focused on active pixel sensor (APS) technology, including silicon charge coupled devices (CCD) and complementary MOS (CMOS) devices. In a camera, solid state sensors convert light into electrical signals, and these signals are used to produce videos or still frame images. One of the photosensor components used in APS imagers is a photocapacitor, often a metal oxide semiconductor (MOS) capacitor.

Markets for solid-state image sensor technology include computer multimedia devices, video phones, toys, cameras, surveillance equipment, automotive, personal imaging equipment, x-ray imaging, manufacturing inspection, and telemedicine.

There is a need for low cost, easy preparation, and high performance methods to fabricate new photodevices such as photodiodes, phototransistors, and photocapacitors.

SUMMARY

Exemplary photocapacitors are disclosed in which the active layer of the photocapacitor includes a metal oxide semiconductor (sometimes referred to in this disclosure as an electronic oxide). The electronic oxide active layer includes one or more metal oxides which are layered with a p-type semiconductor. The active layer may be selected from various metal oxide semiconductors having the formula $Y_{1-x}Sr_xMO_3$, where M=Mn, Co, Cu, Ti, and/or Ni, and x=0 to 0.25. Precursors of the electronic oxide may be yttrium nitrate, yttrium acetate, nickel acetate, nickel nitrate, strontium acetate, and strontium nitrate, for example. The hybrid junction, having electronic oxide semiconductor/semiconductor junction, works in a photocapacitance mode.

In some embodiments, exemplary photocapacitors exhibit a photocapacitance behavior under visible light illumination. In other embodiments, photocapacitance behavior is exhibited under electromagnetic radiation other than visible light. In either case photocapacitance is obtained or else increased from a non-zero baseline capacitance quickly upon irradiation. The photocapacitor device exhibits a change in capacitance with solar irradiation (e.g., exposure to light).

The capacitance of the photocapacitor responds to frequency and intensity of electromagnetic radiation. Photogenerated charge carriers are generated in a depletion layer of the photocapacitor by light. The number of generated charge carriers in the depletion layer of the capacitor generally increases with increasing frequency of the light to which the photocapacitor is exposed.

The photocapacitance may be varied by controlling just the frequency of irradiation. The photocapacitance may be varied by controlling just the intensity of irradiation. The photocapacitance may be varied by controlling both the frequency and intensity of irradiation. Alternatively, the frequency and/or intensity of irradiation may be determined from a measurement of the capacitance of the photocapacitor. Lower frequencies generally result in lower capacitance. Conversely, higher frequencies generally result in higher capacitance.

Some embodiments are wavelength-selector devices. Specific wavelengths (or frequencies) of light are usable to select and set specific capacitance values in the device in a reproducible manner. For example, a first wavelength corresponds with a first capacitance value, and a second wavelength (different from the first wavelength) corresponds with a second capacitance value (different from the first capacitance value). The pairings of particular wavelength with particular photocapacitance do not change over time. As a result, switching irradiation/illumination from the first wavelength to the second wavelength and back again to the first wavelength will still give the first capacitance value. The capacitor responds to a certain wavelength with a specific capacitance value. The device remembers its initial capacitance value with a certain wavelength. This means that the device behaves as a wavelength-selector device.

Some embodiments comprise memcapacitors. Exemplary memcapacitors show a memory effect by remembering an initial capacity value under a certain wavelength for a certain time (longer than 0 seconds) even after the irradiation with the certain wavelength has been discontinued. Even when the device is not excited with a certain wavelength, the device remembers the initial capacitance value selected by the irradiation wavelength and/or intensity.

Advantages of exemplary embodiments include but are not limited to: capacitors that exhibit a high and quickly variable photocapacitance, capacitors that exhibit memory of capacitance values, and devices produced at low cost by easy preparation methods suitable for mass production. Production of exemplary photocapacitors may include one or more of spin-coating, drop coating, printing, doctor blading, spray coating and/or rolling.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1A:
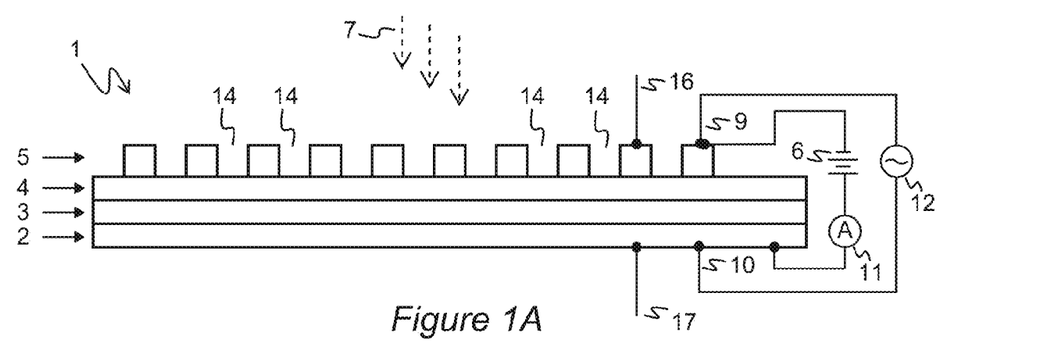
FIG. 1A is a schematic of an exemplary photocapacitor having a metal oxide layer.
Figure 1B:
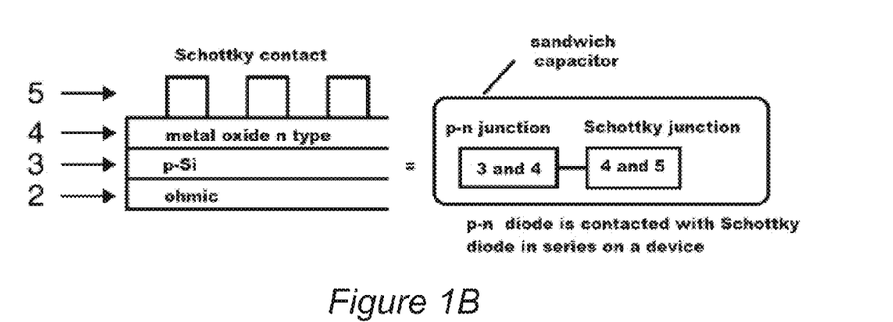
FIG. 1B is an alternative depiction of the exemplary photocapacitor of FIG. 1A.

FIG. 1A is a schematic diagram of an exemplary photocapacitor device 1. FIG. 1B is an alternative depiction of the exemplary photocapacitor device 1. A photocapacitor is an electronic device the capacitance of which may be controlled through photons (irradiation/illumination). The photocapacitor 1 has a sandwich structure comprising ohmic contact 2, a p-type semiconductor 3, a metal oxide active layer 4, and Schottky contact 5. The ohmic contact 2 and Schottky contact 5 constitute opposing conductive electrodes. Such electrodes may consist of or comprise any suitable conductive material, for example elemental metals, alloys of elemental metals, conductive metal compounds, and/or conductively doped semiconductive materials. The opposing electrodes may be of the same or different thicknesses. An example thickness range is from 3 nanometers to 100 nanometers. Furthermore, conductive electrodes may be of the same or different composition relative to one another, and regardless may or may not be homogenous. Exemplary materials for layers/electrodes 2 and 5 include elemental platinum, aluminum, silver, and gold.

The active layer 4 is arranged directly between the p-type semiconductor layer 3 and Schottky contact 5. The active layer 4 may be a dielectric material and may have a layer thickness of over 100 nm. However an exemplary thickness range of the active layer 4 for some embodiments is 3 to 20 mm, or 3 to 15 mm.

In exemplary embodiments, the active layer 4 comprises or consists of yttrium strontium metalate. The metalate may be manganese oxide, titanium oxide, nickel oxide, copper oxide, or cobalt oxide. An exemplary chemical formula of the electronic metal oxide semiconductor of active layer 4 is $Y_{1-x}Sr_xMO_3$, where M=Mn, Co, Cu, Ti, and/or Ni, and x=0 to 0.25, more preferably 0 to 0.20, for example x=0, x=0.01, x=0.05, x=0.15, or x=0.20. The active layer 4 may be coated on the p-type semiconductor layer 3, and together the two layers form a p-n junction diode (which for ease of discussion may be referred to simply as the p-n junction). The p-n junction may be a heterojunction with a hybrid planar structure. The optical band gap of the metal oxide semiconductor of the active layer 4 may be greater than that of p-type semiconductor layer 3.

In some embodiments, an n-type semiconductor may be used instead of a p-type semiconductor. This results in an n-n junction in series with a Schottky junction.

The active layer 4 and Schottky contacts 5 create a Schottky junction diode (which for ease of discussion may be referred to simply as a Schottky junction). The p-n junction is in series with the Schottky junction. The active layer 4 is simultaneously part of both the p-n junction (formed by layers 3 and 4) and the Schottky junction (formed by layers 4 and 5). Altogether the configuration may be referred to as a hybrid junction. The active layer 4, forming part of each of the two junctions which are in series, may be regarded as a junction region. The junction region comprises a depletion layer/region. The photocapacitance of the photocapacitor device 1 is variable in dependence on the size of the depletion layer, which is variable. As a result, the depletion region effectively generates and controls the photocapacitance of the device 1. The depletion region of the photocapacitor comprises the depletion regions of both the p-n junction and Schottky junction.

As shown in FIG. 1A, the metal layer forming the Schottky contact 5 comprises gaps or openings 14 which permit electromagnetic radiation 7 to reach at least one side/face of the active layer 4. Because FIG. 1A is shown in cross-section, the openings 14 have the appearance of separating parts of Schottky contact 5, but from a top view (not depicted) the Schottky contact 5 may appear as a unitary mesh, perforated plane, or grid with all parts in conductive connection with one another such that Schottky contact 5 behaves as a single layer or film of identical or comparable width and length as layers 2, 3, and/or 4.

The Schottky contact 5 may be connected to a remainder of a circuit by connection 16. The Ohmic contact 2 may be connected to a remainder of a circuit by connection 17. The connections 16 and 17 may be conductive wires, for example.

The active layer 4 is light sensitive/photoresponsive. The frequency (or wavelength) of incident radiation is one control variable that may be varied to control the photocapacitance of the device 1. Incident radiation in the visible spectrum may be wavelength of 400 nm to 700 nm, meaning frequency of $7.5 \times 10^{14}$ to $4.3 \times 10^{14}$ Hz. The frequency (or wavelength) of the incident radiation affects the depletion region size. The photocapacitor is illuminated by electromagnetic radiation 7 which may be but is not limited to visible light. Solar light from UV to visible light may be employed, and the photocapacitor device 1 detects the photons. The photocapacitor under illumination promotes an electron from a negative region to a positive region in response to the illumination. The radiation changes the width of depletion region of the p-n and Schottky junctions. The photocapacitance gain of an exemplary photocapacitor device 1 is high, e.g., at least 50 at 10 kHz applied AC field (gain=capacitance at 100 mW/cm$^2$ intensity exposure at 10 kHz divided by the capacitance under dark conditions at 10 kHz). Photocapacitance gain is a ratio of the capacitance under light to dark condition.

The photocapacitor device 1 of FIG. 1A may be a memcapacitor, in which case the device 1 may be referred to as a photomemcapacitor or a memphotocapacitor. Devices which exhibit a "memory" of past electrical conditions based on changes in capacitance are often called memcapacitors or memcapacitive devices. A memcapacitor may be a two-terminal device which has a capacitance that is dependent upon the time integral of the magnitude and polarity of the voltage applied to it. A memcapacitor may be designed to be a linear or nonlinear capacitor depending on the choice of and layout of materials used, and its programming. Memcapacitive behavior is most strongly evident in nanometer scale devices, where a standard driving voltage produces large electric fields. Exemplary memcapacitors may be used for high density data storage, circuit calibration, and/or to provide self-programming, fuzzy logic, or neural learning capabilities. Some photomemcapacitors may be considered wavelength-selector devices. In some embodiments, a memory behavior of the memcapacitor is controlled by wavelengths ranging from 400 nm to 700 nm.

In some exemplary embodiments, the memory state of capacitor is programmed by solar light irradiation. The memcapacitor remembers initial electrical condition for a duration of time after the radiation 7 is terminated. In some exemplary embodiments, the photocapacitor retains the same capacitance value for at least 300 ms after light is removed from the photocapacitor. In some cases exemplary photocapacitors retain the same capacitance value for up to 400 ms after light is removed from the photocapacitor. By contrast, wavelength dependent photocapacitance without memory shows instant capacitance changes, i.e., it does not show a retention of a certain capacitance value for a certain time interval after irradiation is discontinued.

FIG. 1A includes a sourcemeter which may be used for current-voltage measurements using fixed power sources. An exemplary sourcemeter is available commercially from Fytronix. The sourcemeter consists of both a DC voltage source 6 and a current meter (i.e., ammeter) 11. While DC voltage source 6 of the sourcemeter applies a DC voltage from the reverse bias to forward bias, the ammeter 11 of the sourcemeter measures the current passing from the device for each bias voltage. A bias voltage (forward or reverse) affects the thickness of the depletion layer of the active layer 4. The thickness of the depletion layer affects the capacitance.

Figure 1C:
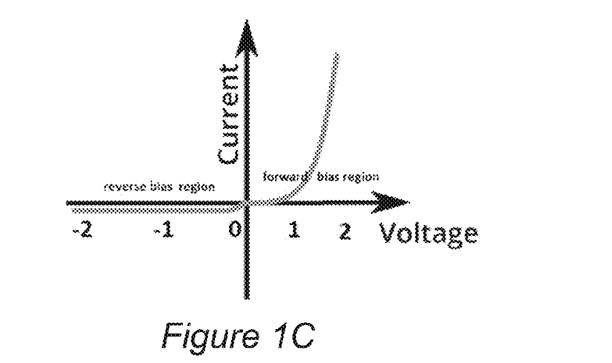
FIG. 1C shows applied voltage versus current for an exemplary photocapacitor being tested with a sourcemeter instrument.

The DC voltage source 6 of the sourcemeter applies a voltage from negative voltages to positive voltages with a step voltage. For example, the DC voltage source 6 applies from −2V to +2V with a step of 0.001 V, as shown in FIG. 1C. The reverse bias region is −2V to 0, and the forward bias region is from 0 to 2V. As used herein, the reverse bias region for the device is the region where negative voltages are applied across the layers. The forward bias region for the device is the region where positive voltages are applied across the layers. The DC voltage source 6 establishes an electric field (E) in which the active layer 4 is positioned. More specifically, the electric field (E) is produced between the layers 2 and 5 which serve as electrode and counter-electrode, and layers 3 and 4 are positioned within the electric field. The electric field (E) applies a field with strength equal to V/d, where V is the applied voltage and d is the thickness of the capacitor. The thickness d of the capacitor may be taken as the combined thicknesses of layers 3 and 4. A capacitance-voltage analyzer may also apply an AC electric field with an AC voltage source 12.

Exemplary photocapacitor devices may be manufactured in several different ways. However, exemplary procedures generally comprise or consist of the following: making a metal oxide solution, forming a metal oxide layer on a semiconductor substrate using the metal oxide solution, forming an electrode layer on the exposed surface of the metal oxide layer, and forming an electrode layer on the exposed surface of the substrate.

According to some embodiments, the metal oxide solution and metal oxide layer are prepared by a sol gel spin coating method. The solution may be prepared with precursors such as metal salts (e.g., acetate and nitrates) mixed in organic solvents, (de-ionized) water, or alcohols. Exemplary precursors for the metal oxide solution are yttrium nitrate, yttrium acetate, nickel acetate, nickel nitrate, strontium acetate, and strontium nitrate. In some embodiments, an ultrasonic wave is applied to the metal oxide solution. For instance, precursors are dissolved in water and stirred by ultrasonic waves for at least 10 minutes.

The metal oxide solution is then deposited or coated on a semiconductor substrate, e.g. either a p-type silicon or an n-type silicon. The coating is preheated at at least 150° C. for at least 5 minutes to obtain a solid film. The solid film is annealed at e.g. 400° C. for at least 1 hour. A post annealing treatment may be performed at a low temperature for a short time on a hot plate in air atmosphere.

The spin coating method allows to easy preparation of a metal oxide semiconductor film with tailored photocapacitance properties. The temperature may be 350-550° C. (e.g., 400° C.) for a sol gel spin coating method.

As an alternative to the sol gel method, a solution of metal oxide is dried e.g. at 90° C. for 12 h, and the obtained powder is calcinated e.g. at 400° C. for 2 h. The obtained power is dispersed in an organic solvent such as ethanol, methanol, or some other organic solvent. Then, obtained solution is drop coated on a p-type semiconductor (e.g., p-Si) and the coated p-Si is dried at e.g. 50° C. for 1 h.

A sputtering system may be used to prepare the bottom and top electrodes (the ohmic and Schottky contacts). The electrodes may be formed from metals such as aluminum, platinum, gold, or silver.

Example

A prototypical photomemcapacitor in accordance with FIGS. 1A and 1B was produced with analytical grade reagents supplied by Aldrich Company. The raw materials were used as purchased without further purification. Millipore MilliQ purified deionized water was used in all operations requiring water.

Metal oxide solution prepared by the sol gel method. The precursors of metal oxide were yttrium acetate, strontium acetate, and nickel acetate. The nominal values of the precursors were dissolved in ionized water for 1 h.

The obtained gel solution of metal oxide was then coated on p-Si at 1500 RPM for 30 seconds using a spin coating method. The coating was then preheated at 150° C. for 5 minutes to obtain a solid film. Finally the metal oxide layer was annealed at 400° C. for 1 hour.

The exposed surface of the p-Si and the exposed surface of the metal oxide layer were then each coated with aluminum using an RF sputtering system to form the Schottky contact layer and Ohmic layer. A screen was used to provide gaps in the Schottky contact layer for radiation to be able to reach the metal oxide layer.

The photocapacitance characteristics of the completed capacitor was measured and photocapacitance gain was determined. Experimental results were obtained from a variety of relevant instrumental studies of the metal oxide layer to offer insights into the morphology and electrical characteristics. The results are laid out in FIGS. 2-8. Control variables/stimuli and data collection were managed using a Wavelength Controller, Sourcemeter, and Capacitance-Voltage Analyzer (available from FYTRONIX). The FYTRONIX Wavelength Controller was configured to supply light exposure at specific wavelengths from 400 to 700 nm in steps. The semiconductor was exposed for a fixed period of time at each step before the wavelength was changed to the next step.

The FYTRONIX sourcemeter measured current-voltage measurements. A FYTRONIX capacitance-voltage analyzer applied an AC electric field of 100 mV with an AC voltage source 12 (see FIG. 1A). Because the external DC power source 6 also applied a DC electric field, the result was a DC electric field superimposed on an AC electric field during measurement of capacitance-voltage measurements. The external DC voltage power source 6 was applied for DC current-voltage characteristics. The AC voltage power source 12 was applied for capacitance-voltage characteristics by imposing on the DC voltage.

Figure 2:
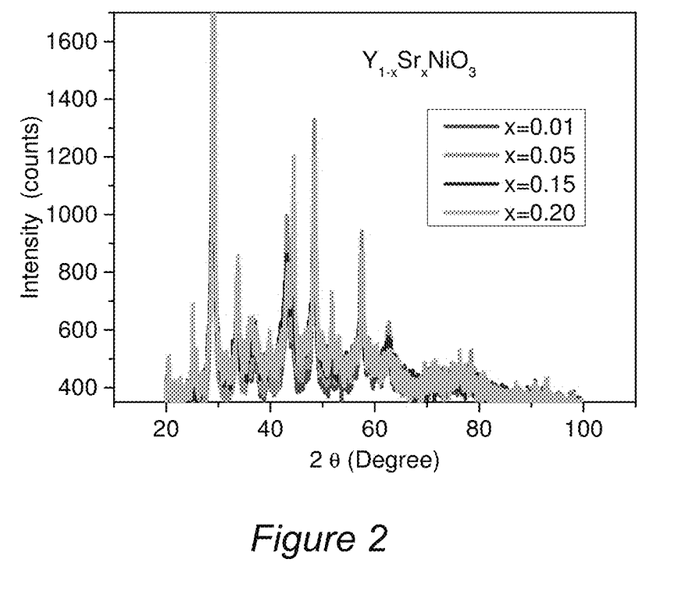
FIG. 2 is a plot of x-ray diffraction (XRD) spectra of metal oxide layers, $Y_{1-x}Sr_xNiO_3$, of four exemplary photocapacitors. The plot confirms the four chemical compositions and that the active layers are formed from the polycrystals.

FIG. 2 is a plot of x-ray diffraction (XRD) spectra of the metal oxide layers, $Y_{1-x}Sr_xNiO_3$, of four exemplary photocapacitors. The plot confirms the chemical compositions and that the active layers are formed from the polycrystals.

The exemplary device was tested under various intensities of light exposure while different AC field frequencies were applied. Sunlight was used with a wavelength from 350 nm to 1100 nm. The results are arrayed in FIGS. 3A-3C and 4A-4C. It was found that the device exhibited the highest number of charge carriers at at least 10 kHz applied AC field. When the capacitor is switched with 10 kHz, the number of charge carriers is the highest in the depletion layer of capacitor, i.e., the interface states is highest at 10 kHz. The interface state is defined as the number of charge carriers at interface of the capacitor. This means that the tested capacitor exhibited highest photocapacitance at 10 kHz.

Figure 3A:
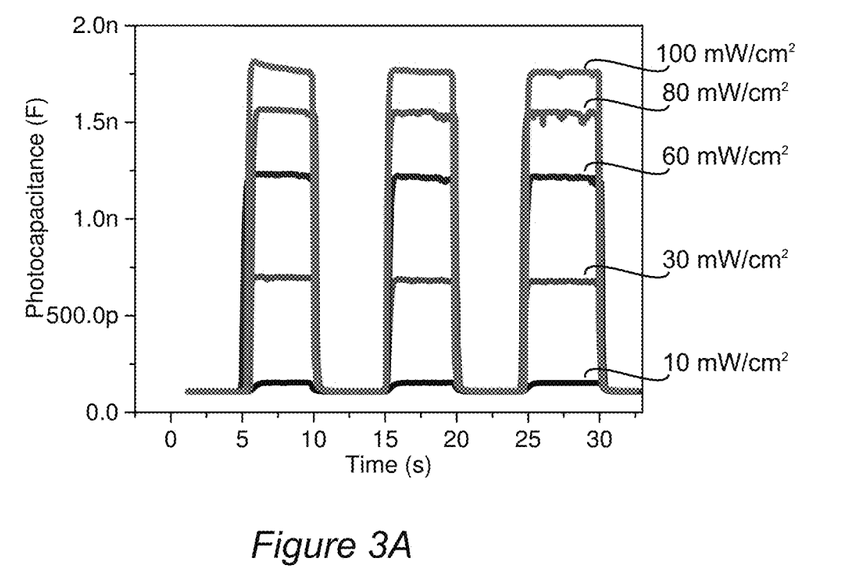
FIG. 3A is a plot of photocapacitance-time characteristics of an exemplary photocapacitor under various illumination intensities at 10 kHz applied AC field.

FIG. 3A is a plot of photocapacitance-time characteristics of the exemplary photocapacitor under various illumination intensities at 10 kHz applied AC electric field from AC voltage source 12 (see FIG. 1A) of a FYTRONIZ capacitance-voltage analyzer.

Figure 3B:
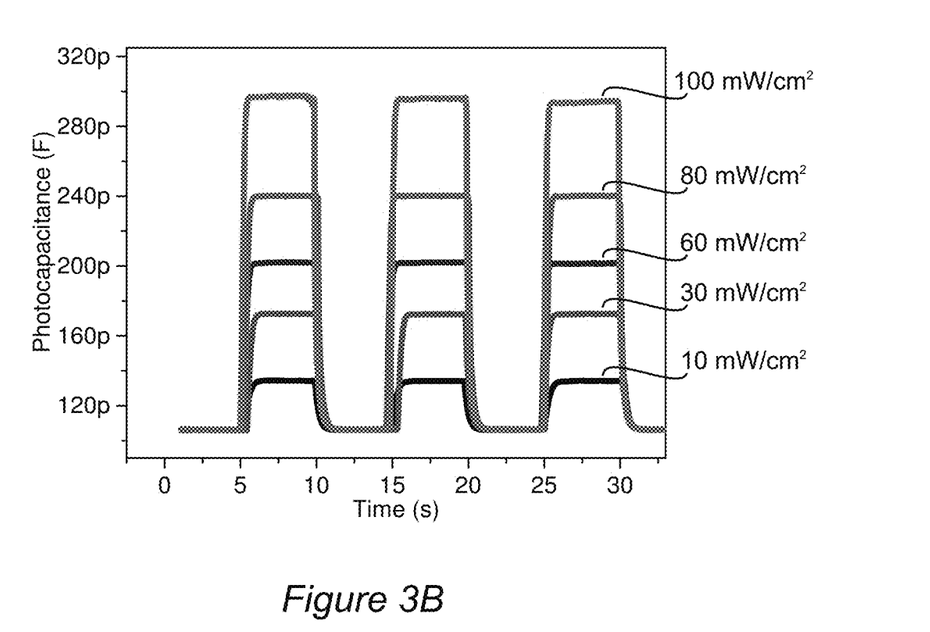
FIG. 3B is a plot of photocapacitance-time characteristics of an exemplary photocapacitor under various illumination intensities at 100 kHz applied AC field.

FIG. 3B is a plot of photocapacitance-time characteristics of the exemplary photocapacitor under various illumination intensities at 100 kHz applied AC electric field from AC voltage source 12 (see FIG. 1A) of a FYTRONIZ capacitance-voltage analyzer.

Figure 3C:
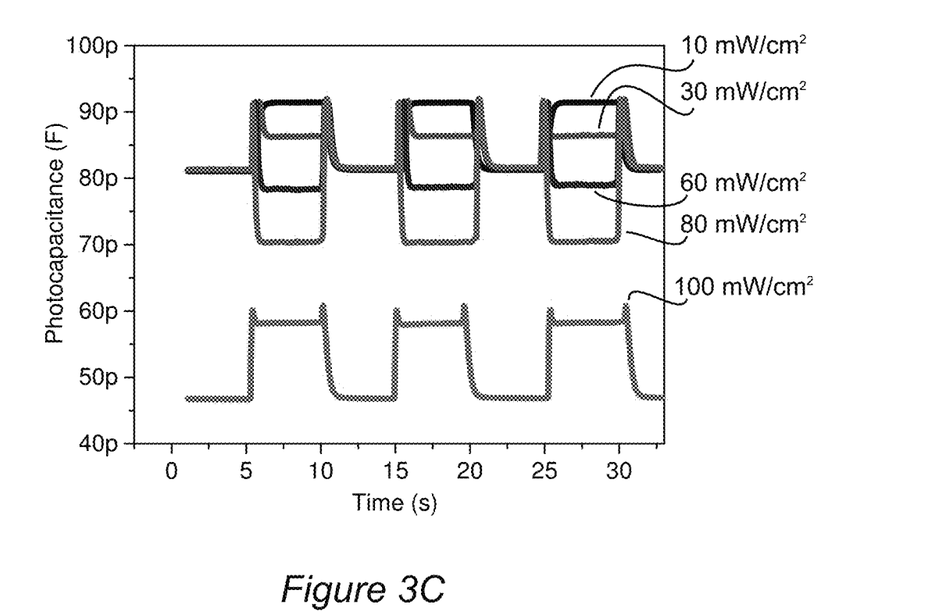
FIG. 3C is a plot of photocapacitance-time characteristics of an exemplary photocapacitor under various illumination intensities at 1 MHz applied AC field.

FIG. 3C is a plot of photocapacitance-time characteristics of the exemplary photocapacitor under various illumination intensities at 1 MHz applied AC electric field from AC voltage source 12 (see FIG. 1A) of a FYTRONIZ capacitance-voltage analyzer.

Figure 4A:
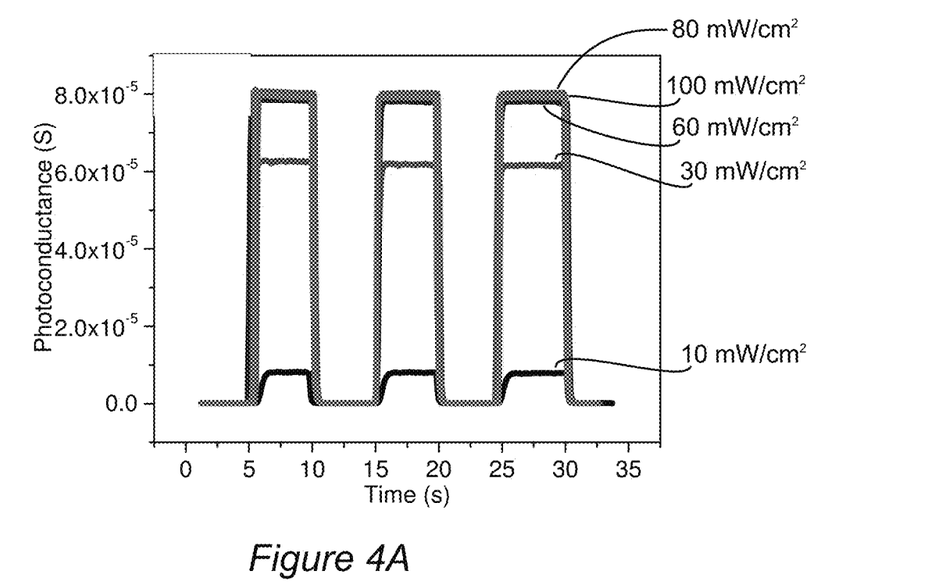
FIG. 4A is a plot of photoconductance-time characteristics of an exemplary photocapacitor under various illumination intensities at 10 kHz applied AC field.

FIG. 4A is a plot of photoconductance-time characteristics of the exemplary photocapacitor under various illumination intensities at 10 kHz applied AC electric field from AC voltage source 12 (see FIG. 1A) of a FYTRONIZ capacitance-voltage analyzer.

Figure 4B:
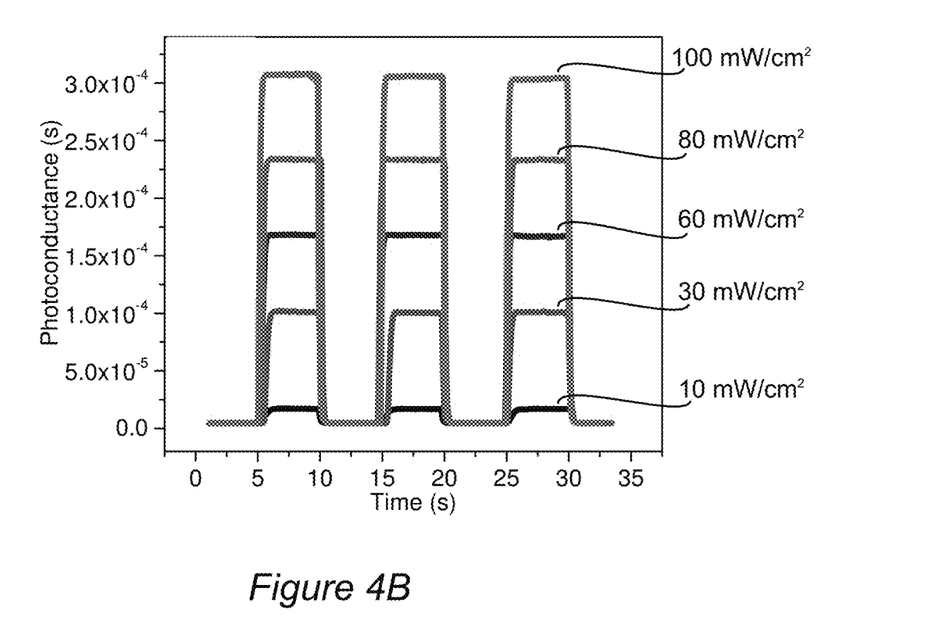
FIG. 4B is a plot of photoconductance-time characteristics of an exemplary photocapacitor under various illumination intensities at 100 kHz applied AC field.

FIG. 4B is a plot of photoconductance-time characteristics of the exemplary photocapacitor under various illumination intensities at 100 kHz applied AC electric field from AC voltage source 12 (see FIG. 1A) of a FYTRONIZ capacitance-voltage analyzer.

Figure 4C:
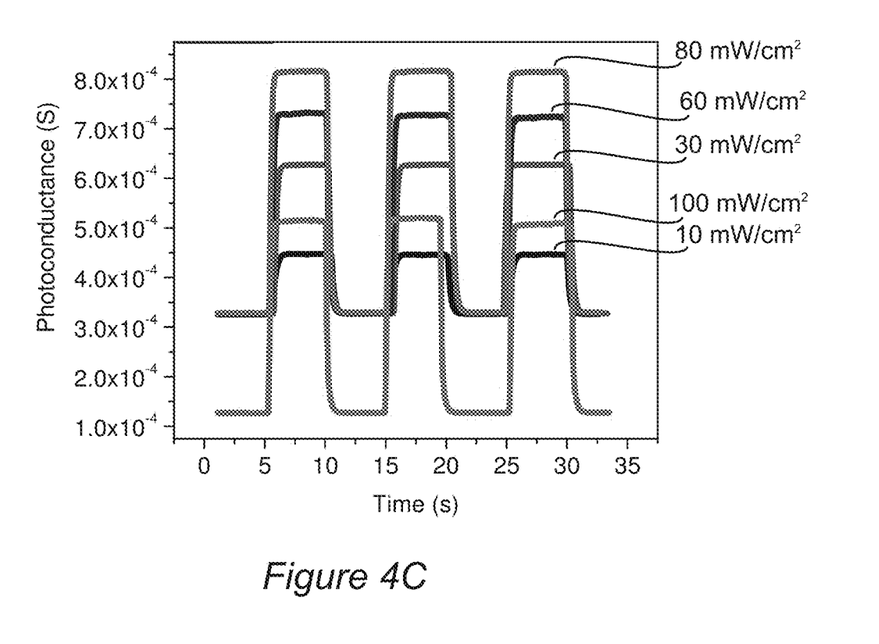
FIG. 4C is a plot of photoconductance-time characteristics of an exemplary photocapacitor under various illumination intensities at 1 MHz applied AC field.

FIG. 4C is a plot of photoconductance-time characteristics of the exemplary photocapacitor under various illumination intensities at 1 MHz applied AC electric field from AC voltage source 12 (see FIG. 1A) of a FYTRONIZ capacitance-voltage analyzer.

Figure 5:
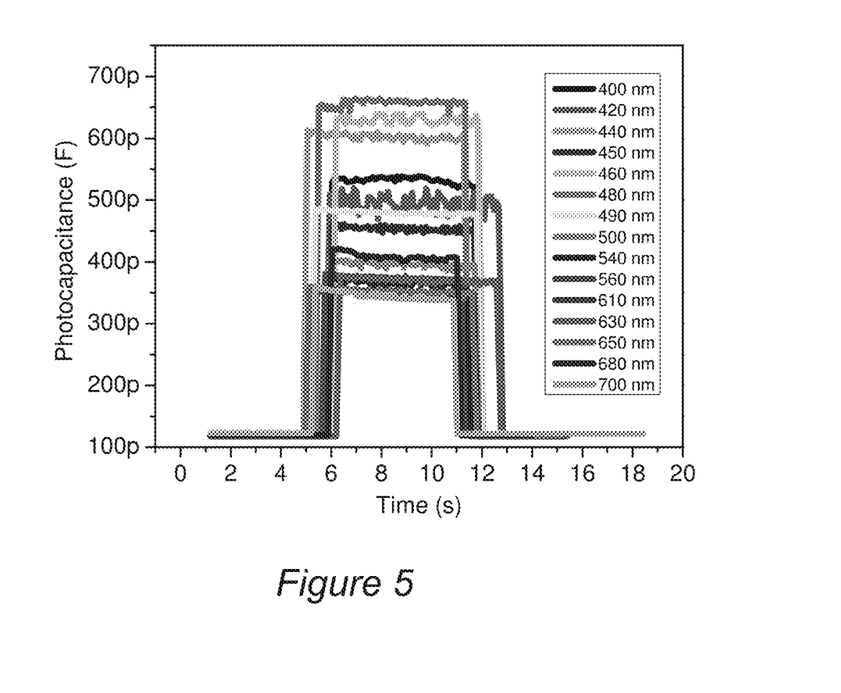
FIG. 5 is a plot of photocapacitance-time characteristics of an exemplary photocapacitor under various wavelengths of light and under 100 mW/cm$^2$ intensity.

FIG. 5 is a plot of photocapacitance-time characteristics of the exemplary photocapacitor under various wavelengths of light and under 100 mW/cm² intensity. The switching time is the time required for memory to the initial electrical condition. Switching time is the time for memory.

Figure 6:
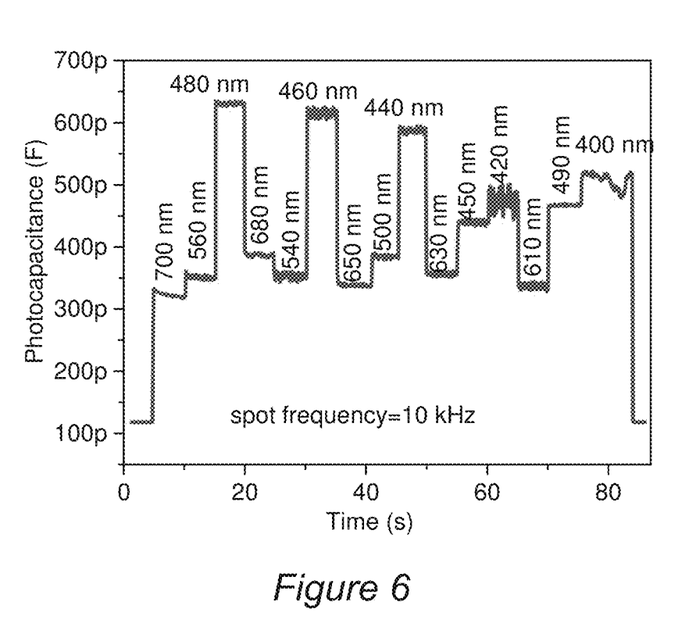
FIG. 6 is a plot of memcapacitor characteristics under 100 mW/cm$^2$ intensity of light.

FIG. 6 is a plot of memcapacitor characteristics under 100 mW/cm² intensity of light. The plot of the capacitance-time indicates a memory state and re-memory state by solar light illumination. The memory effect of the capacitor mainly results from the photogenerated charge controlled mechanism in the active layer. The device shows a memory effect by remembering an initial capacity value under a certain wavelength for a certain time even after the irradiation with the certain wavelength has been discontinued. Spot frequency of the applied AC field was a constant 10 kHz.

As seen in FIG. 6, the capacitance remains constant over a period of time that the applied wavelength is held constant. The fact that the capacitance remains constant over a certain period of time indicates that the device writes the capacity value under a certain wavelength. When the device is excited with a different wavelength, the device changes to the capacitance value that pairs to the new wavelength and holds that capacitance value so long as the wavelength continues to remain unchanged.

Figure 7:
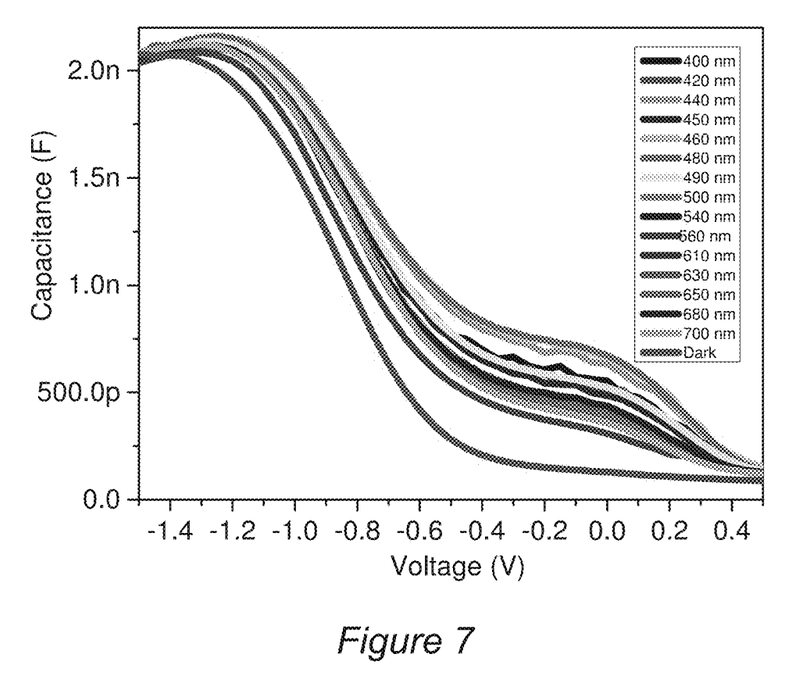
FIG. 7 is a plot of photocapacitance-voltage characteristics of the photocapacitor under various wavelengths at 100 mW/cm$^2$ light intensity.

FIG. 7 is a plot of photocapacitance-voltage characteristics of the photocapacitor under various wavelengths at 100 mW/cm² light intensity. An electric voltage is applied by external DC power source 6 to the ohmic and Schottky contacts 2 and 5 to create either a forward or reverse bias (see FIG. 1A). At the same time, the photocapacitor device is illuminated by electromagnetic radiation 7. The photocapacitor absorbs the solar light at the active layer 4. Photogenerated charges are generated in the active layer. FIG. 7 shows clearly the effects of the following variables on capacitance: radiation vs no radiation (i.e., darkness), wavelength of radiation, and voltage of applied DC electric field.

As shown in FIG. 7, in the absence of any radiation and any applied voltage, an exemplary device may still exhibit non-zero capacitance. The application of light of any wavelength from 400 to 700 nm increases the capacitance of the device with respect to its baseline capacitance in darkness. The application of a reverse bias voltage increases the capacitance. Between 0 and −1.25 V, the greater the magnitude of the reverse bias, the greater the capacitance. A reverse bias magnitude greater than −1.25 V may but not does necessarily result in greater capacitance. As shown in FIG. 7, too great a reverse bias can reduce capacitance from its peak value. The application of a forward bias voltage reduces the capacitance. Between 0 and 0.45 V, the greater the magnitude of the forward bias, the lesser the capacitance. A forward bias with magnitude greater than 0.45 V may or may not result in significant further reduction in capacitance.

Figure 8:
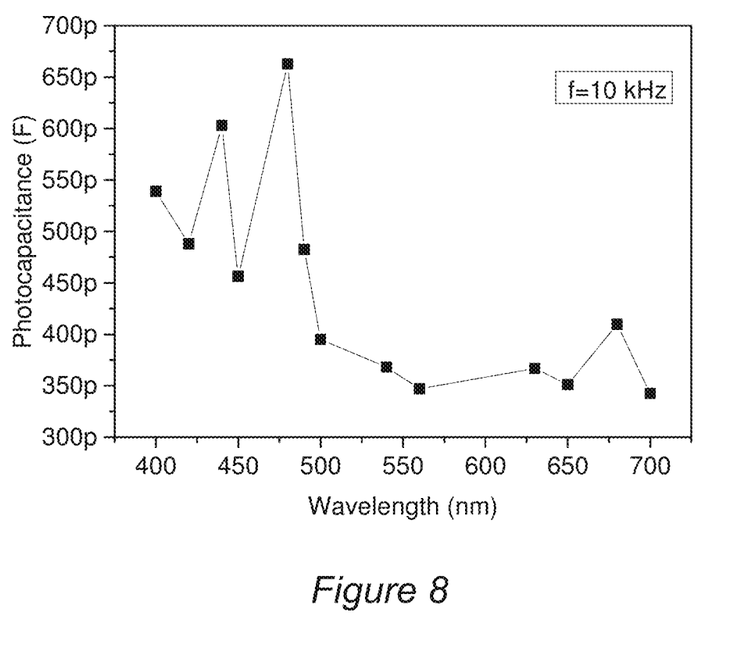
FIG. 8 is a plot of photocapacitance-wavelength characteristics of the photocapacitor under 100 mW/cm$^2$ light intensity.

FIG. 8 is a plot of photocapacitance-wavelength characteristics of the photocapacitor under 100 mW/cm² light intensity and an AC applied field of 10 kHz. The photocapacitance mechanism of the capacitor mainly results from the photogenerated charges in the depletion regions of p-n junction and Schottky junction. As shown in FIG. 8, shorter wavelength (and therefore higher frequency) generally corresponds with greater photocapacitance, while longer wavelength (and therefore lower frequency) generally corresponds with lower photocapacitance. However, the relationship is not linear. The highest photocapacitance was observed at 480 nm wavelength.

It is to be understood that the terminology used herein is for the purpose of describing particular embodiments only, and is not intended to be limiting, since the scope of the present invention will be limited only by the appended claims.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. As will be apparent to those of skill in the art upon reading this disclosure, each of the individual embodiments described and illustrated herein has discrete components and features which may be separated from or combined with the features of any of the other several embodiments without departing from the scope or spirit of the present invention. Any recited method can be carried out in the order of events recited or in any other order which is logically possible.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are described.

What is claimed is:

1. A photocapacitor, comprising
a single electronic device with a p-n junction in series with a Schottky junction, wherein the single electronic device is comprised of
an active layer with first and second sides wherein the active layer comprises $Y_{1-x}Sr_xMO_3$, wherein M=Mn, Co, Cu, Ti, or Ni, and wherein $0 \leq x \leq 0.25$;
a first metal layer at the first side of the active layer wherein the first metal layer is gold or platinum and wherein an interface of the active layer and the first metal layer forms the Schottky junction;
a p-type semiconductor at the second side of the active layer wherein the p-type semiconductor is p-Si and wherein an interface of the active layer and p-type semiconductor forms the p-n junction.

2. The photocapacitor of claim 1, wherein the active layer comprises a hybrid depletion region for both the p-n junction and the Schottky junction.

3. The photocapacitor of claim 2, wherein a size of the hybrid depletion region controls photocapacitance of the photocapacitor.

4. The photocapacitor of claim 1, wherein a photocapacitance gain of the photocapacitor is controlled by both a frequency of irradiation and an applied electric field.

5. The photocapacitor of claim 4, wherein the photocapacitance gain is at least 50 during application of 10 kHz alternating current electric field.

6. The photocapacitor of claim 1, wherein the photocapacitor is a memcapacitor.

7. The photocapacitor of claim 6, where a photocapacitance of the memcapacitor is controlled by wavelengths ranging of 400 nm to 700 nm.

8. The photocapacitor of claim 1, wherein the first metal layer comprises gaps or openings that permit electromagnetic radiation to reach the first side of the active layer.

* * * * *